(12) United States Patent
Feudel et al.

(10) Patent No.: US 6,808,970 B2
(45) Date of Patent: Oct. 26, 2004

(54) SEMICONDUCTOR DEVICE HAVING AN IMPROVED STRAINED SURFACE LAYER AND METHOD OF FORMING A STRAINED SURFACE LAYER IN A SEMICONDUCTOR DEVICE

(75) Inventors: Thomas Feudel, Radebeul (DE); Christian Krueger, Liegau-Augustusbad (DE); Lutz Herrmann, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/602,583

(22) Filed: Jun. 24, 2003

(65) Prior Publication Data
US 2004/0126998 A1 Jul. 1, 2004

(30) Foreign Application Priority Data
Dec. 27, 2002 (DE) .......................................... 102 61 307

(51) Int. Cl.$^7$ ................... H01L 21/338; H01L 21/8238; H01L 21/04; H01L 21/265
(52) U.S. Cl. ...................... 438/174; 438/217; 438/511; 438/518
(58) Field of Search .................................. 438/174, 181, 438/217, 288, 511, 518

(56) References Cited

U.S. PATENT DOCUMENTS

| | | | |
|---|---|---|---|
| 3,969,744 A | 7/1976 | Nicholas et al. | 357/22 |
| 4,053,925 A | 10/1977 | Burr et al. | 357/64 |
| 4,728,619 A | 3/1988 | Pfiester et al. | 438/451 |
| 5,426,069 A | * 6/1995 | Selvakumar et al. | 438/60 |
| 5,650,350 A | * 7/1997 | Dennison et al. | 438/211 |
| 6,638,832 B2 | * 10/2003 | Brady et al. | 438/424 |

* cited by examiner

Primary Examiner—William M. Brewster
(74) Attorney, Agent, or Firm—Williams, Morgan & Amerson, P.C.

(57) ABSTRACT

A manufacturing process for fabricating field effect transistors is disclosed comprising the generation of a strained surface layer on the surface of the substrate on which the transistor is to be fabricated. The strained surface layer is generated by implanting xenon and/or other heavy inert ions into the substrate. Implantation can be performed both after or prior to the gate oxide growth. The processing afterwards is carried out as in conventional MOS technologies. It is assumed that the strained surface layer improves the channel mobility of the transistor.

16 Claims, 4 Drawing Sheets ns of the transistor 100, respectively. Moreover, in FIG.
SEMICONDUCTOR DEVICE HAVING AN IMPROVED STRAINED SURFACE LAYER AND METHOD OF FORMING A STRAINED SURFACE LAYER IN A SEMICONDUCTOR DEVICE

BACKGROUND OF THE INVENTION

1. Field of the Invention

The present invention relates to the fabrication of integrated circuits, and, more particularly, to the implanting of ions of dopant materials into workpieces and/or substrates suitable for the fabrication of integrated circuits. More specifically, the present invention relates to a method of forming a strained surface layer into substrates during the fabrication of field effect transistors.

2. Description of the Related Art

In the last several years, the number of circuit elements manufactured on semiconductor substrates has continuously grown, and accordingly the size of circuit elements commonly fabricated has continuously decreased. Moreover, modern manufacturing technologies have developed so as to include several ion implanting steps. For instance, ion implanting steps are currently performed for the purpose of forming well structures, halo structures, source and drain regions, and the like. However, as the miniaturization of the circuit elements has developed, the need has arisen to restrict the doping profiles of the various implants within well-defined locations. That is, implantations need to be confined within regions of the substrate having dimensions in conformity with the reduced feature sizes of the circuit elements, e.g., transistors, to be formed. To obtain the shallow doping profiles required, all physical mechanisms allowing dopants to penetrate deeper into the substrate must be strictly controlled or eliminated. One important factor to be controlled is ion channeling. To accomplish this end, shallow profile doping processes often use a so-called "pre-amorphization" implantation step prior to the actual dopant implantations. In particular, an amorphous zone is usually formed during a first pre-amorphization implantation, and, during subsequent implantation processes, the doped regions (halo and source/drain regions) are formed. Commonly, heavy inert ions like germanium or xenon are implanted at an implant energy of approximately 80–200 keV.

In the following, a brief description will be given with reference to FIGS. 1a–1c of a typical prior art process for forming the active regions of a field effect transistor, including a typical "pre-amorphization" implanting step.

FIG. 1a schematically shows a MOS transistor 100 to be formed on a substrate 1, such as a silicon wafer. Isolation structures 2 define an active region of the transistor 100. Moreover, reference 3 relates to a polysilicon gate electrode of the MOS transistor 100. Finally, reference 6 denotes a gate insulation layer.

In FIGS. 1b–1c, those parts already described with reference to FIG. 1a are identified by the same reference numerals. In addition, in FIG. 1b, reference 7a relates to an ion beam to which the substrate 1 is exposed during a "pre-amorphization" implanting process, and reference 5a relates to amorphous regions formed into the substrate 1.

FIG. 1c shows the MOS transistor 100 once the active regions have been completed. In particular, in FIG. 1c, reference 5h relates to halo regions formed into the substrate and references 5S and 5D identify the source and drain regions of the transistor 100, respectively. Moreover, in FIG. 1c, reference 4 relates to dielectric sidewall spacers formed on the sidewalls of the polysilicon line 3.

A typical process flow for forming the active regions of the transistor 100 comprising the amorphous regions 5a, the halo structures 5h and the source and drain regions 5S and 5D may be summarized as follows.

Following the formation of the gate insulation layer 6 and the overlying polysilicon line 3 according to well known lithography and etching techniques (see FIG. 1a), the amorphous regions 5a are formed during a first implant-step (see FIG. 1b). To this end, the substrate 1 is exposed to an ion beam 7a and heavy-ions such as, for example, phosphorous, arsenic, and argon are implanted into the substrate at an implanting energy of about 80 keV.

Once the amorphous regions 5a have been formed as described above, the manufacturing process is resumed, and several further implanting steps are carried out for the purpose of forming the halo structures 5h and the source and drain regions 5S and 5D. In particular, during a so-called halo implanting step, boron ions in NMOS transistors and phosphorous ions in PMOS transistors are implanted at 90 keV with a dose of $2\times10^{13}$ cm$^{-2}$. After forming the halo structures 5h, a subsequent implanting step is carried out for forming the source and drain extension regions (not shown) of the transistor 100. To this end, a dose of approximately $3\times10^{13}$–$3\times10^{14}$ cm$^{-2}$ dopant ions is implanted at low energy (30–50 keV). Similar to the halo implantation step, this implantation step causes the edges of the implanted regions to be substantially aligned with the edge of the gate insulation layer 6. Subsequently, dielectric sidewall spacers 4 are formed on the sidewalls of the polysilicon line 3 according to well known techniques, and a further heavy implantation step is carried out for implanting dopants into those regions of the substrate not covered by the polysilicon line 3 and the sidewall spacers 4. At the end of the heavy implantation step, the source and drain regions 5S and 5D are formed to exhibit the desired concentration.

The prior art manufacturing process as depicted above is affected by several drawbacks. For instance, the mobility in the channel region, i.e., in the portion of the substrate underlying the gate insulation layer 6 and between the source and drain regions 5S and 5D, is too low when compared to the high speed and high performance required in modern transistors. Moreover, damage results in the substrate in proximity to the source-drain junction during the pre-amorphization implanting step as depicted in FIG. 1b so that leakage currents may arise, leading to malfunctioning of the transistor.

Many efforts have been made and several solutions have been proposed in the art to overcome at least some of these drawbacks. In particular, it has been proposed to improve the mobility of the electrical charges in the channel region by forming a strained surface layer on the; substrate at the beginning of the manufacturing process, i.e., before forming the polysilicon structure 3 and before the usual implanting steps are carried out. In the following, a description will be given with reference to FIGS. 2a–2d of a typical prior art process for forming the active regions of a field effect transistor, including a typical step for generating a strained surface layer on the substrate.

FIG. 2a schematically shows a substrate 1, such as a silicon wafer, on which a MOS transistor is to be formed. Isolation structures 2 define an active region of the transistor 100. Moreover, reference 1e identifies a strained layer that is formed on the surface of the substrate 1, as will be described in the following. In the particular example depicted in FIG.

2a, it is assumed that the strained layer 1e is formed after formation of the isolation structures 2. However, processes are known in the art according to which the strained layer 1e is formed first and the isolation structures 2 are formed thereafter.

In FIGS. 2b–2c, those parts already described with reference to FIGS. 2a and 1a–1c are identified by the same reference numerals. Accordingly, reference 7a in FIG. 2b identifies an ion beam to which the substrate 1 is exposed for the purpose of forming amorphous regions 5a. Moreover, in FIG. 2b, reference 6 relates to a gate insulation layer and reference 3 relates to a polysilicon line formed thereon. Finally, in FIG. 2c, reference 4 relates to sidewall spacers formed on the sidewalls of the polysilicon line 3, while the references 5h, 5S and 5D identify halo structures and source and drain regions of the transistor 100, respectively. The polysilicon line 3, the gate insulation layers 6, the halo structures 5h and the source and drain regions 5S and 5D may be formed according to the method steps already described with reference to FIGS. 1a–1c. In the same way, the sequence of these process steps may be the same as described with reference to FIGS. 1a–1c.

The prior art process for forming a transistor as depicted in FIGS. 2a–2c starts with the formation of a strained surface layer 1e on the surface of the substrate 1 (see FIG. 2a). To this end, a silicon layer is epitaxially grown on a relaxed $Si_{1-x}Ge_x$ (not shown) previously formed on the surface of the silicon substrate 1. However, the relaxed $Si_{1-x}Ge_x$ layer is formed by intentionally alloying the initially deposited silicon with germanium. Since the Si—Ge alloy has a substantially different lattice parameter than the substrate, a strained layer is formed on the surface of the substrate with relaxed $Si_{1-x}Ge_x$. In addition to the energy band splitting associated with the vertical electric field in the MOS structure, the strain induces an energy splitting, $\Delta E_s \sim 67$ meV/10% Ge, associated with the crystal asymmetry, increasing the overall splitting $\Delta E_{tot}$ between the perpendicular ($\Delta_2$) and parallel ($\Delta_4$) conduction bands. The resulting re-population of the energy bands produces enhancement of the low field effective electron mobility $\mu_{eff}$.

Once the strained surface layer 1e has been formed, the transistor 100 is completed according to the usual manufacturing techniques. In particular, a gate insulation layer is formed on the substrate 1 and patterned according to well-known masking and etching techniques so as to form the gate insulation structure 6. Subsequently, the polysilicon line 3 is formed on the gate insulation structure 6 still according to well-known depositing, patterning, and etching techniques. Finally, once the polysilicon gate structure has been formed, the manufacturing process is prosecuted as substantially depicted with reference to FIGS. 1b–1c so as to form the active regions of the transistor 100 of FIG. 2c, comprising halo structures 5h and source and drain regions 5S and 5D, with sidewall spacers 4 being formed on the sidewalls of the polysilicon gate structure. However, at the end of the manufacturing process, the transistor will comprise a strained layer 1e in the channel region, i.e., in the region of the transistor underlying the gate insulation layers 6 and between the source and drain regions 5S and 5D (see FIG. 2c). As stated above, it is considered that the strained layer 1e exhibits an improved mobility of the electrical charges in the channel region, so that a higher switching speed and improved electrical performances of the transistor may be obtained.

However, the generation of a strained surface layer 1e as depicted above is quite troublesome and expensive, and as such cannot be easily implemented in a production process. In fact, complex machinery is required for epitaxially growing the Si—Ge strained surface layer 1e and the process parameters have to be attentatively controlled, otherwise crystalline defects, such as misfit dislocations, could be generated which could negatively affect the functioning of the transistor.

Accordingly, in view of the problems explained above, it would be desirable to provide a technique that may solve or at least reduce one or more of these problems. In more detail, it would be desirable to provide a technique that improves the mobility in the channel region of a field effect transistor, thus improving the switching speed and the electrical performance of the transistor. In particular, it would be desirable to provide a simple technique that creates a very homogenous strained layer on the surface of a substrate.

SUMMARY OF THE INVENTION

In general, the present invention is based on the consideration that field effect transistors exhibiting improved performance can be fabricated when, in addition to the conventional processing steps, a strained surface layer is generated by implanting heavy inert ions into the substrate. In particular, the present invention is based on the consideration that a very homogenously strained layer exhibiting a mobility at least as good as the mobility exhibited by epitaxially grown prior art layers may be obtained by implanting xenon and/or other large, heavy and inert ions into the substrate. Once such a strained layer has been generated, the transistor may be completed according to well-known prior art techniques. However, at the end of the manufacturing process, the transistor will exhibit a switching speed and electrical performance that are at least as good as the switching speed and electrical performance exhibited by a transistor comprising an epitaxial strained layer.

According to one embodiment, the present invention relates to a method of forming at least one field effect transistor on a semiconductive substrate comprising generating a strained surface layer on a surface of the substrate by implanting ions of at least one heavy inert material through the surface of the substrate. The method further comprises forming at least one gate structure above the strained surface layer.

According to another embodiment, the present invention relates to a method of forming at least one field effect transistor on a semiconductive substrate comprising forming an insulating film on a surface of the substrate and generating a strained surface layer at the interface of the insulating film and the substrate by implanting ions of at least one heavy inert material through the insulating film into the substrate. The method further comprises forming a gate insulating structure.

BRIEF DESCRIPTION OF THE DRAWINGS

The invention may be understood by reference to the following description taken in conjunction with the accompanying drawings, in which like reference numerals identify like elements, and in which.

Figure 1A:
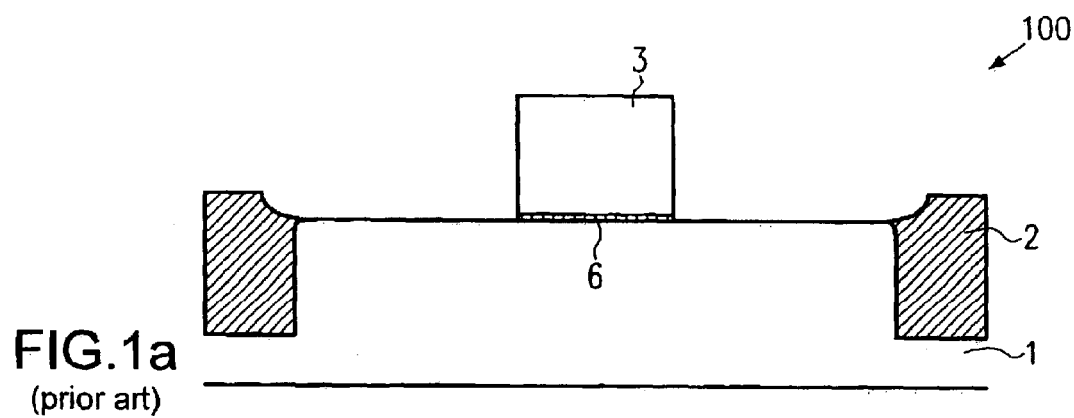
FIGS. 1a–1c represent a typical process sequence of a prior art method of forming the active regions of a field effect transistor comprising a pre-amorphizing implantation step.
Figure 1B:
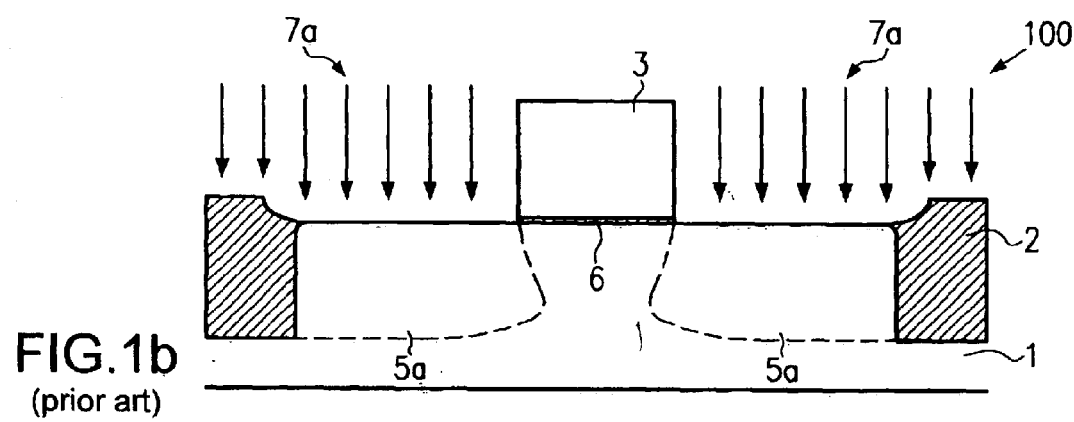
Figure 1C:
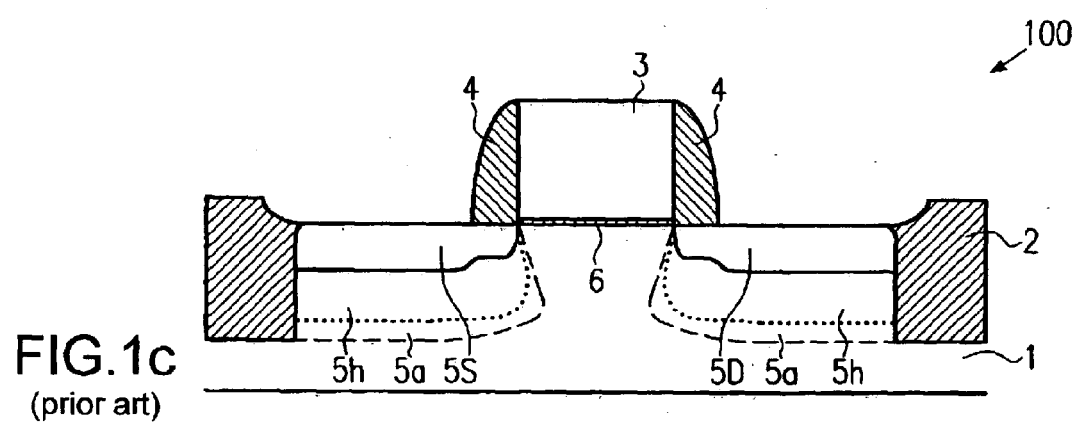
Figure 2A:
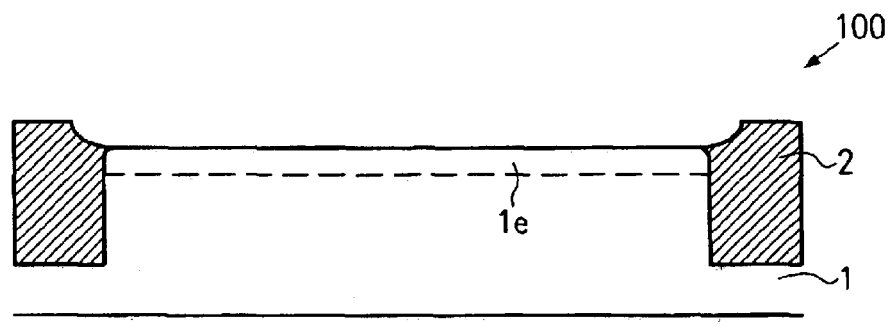
FIGS. 2a–2c represent a process sequence of a prior art method of forming the active regions of a field effect transistor comprising epitaxially growing a strained surface layer on the substrate.
Figure 2B:
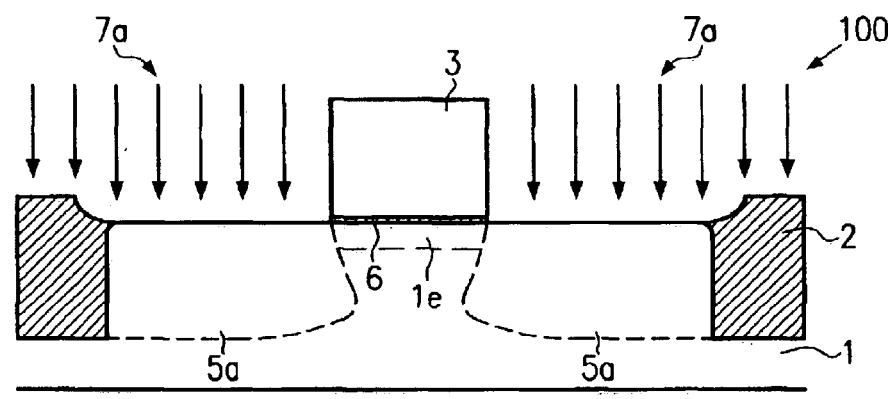
Figure 2C:
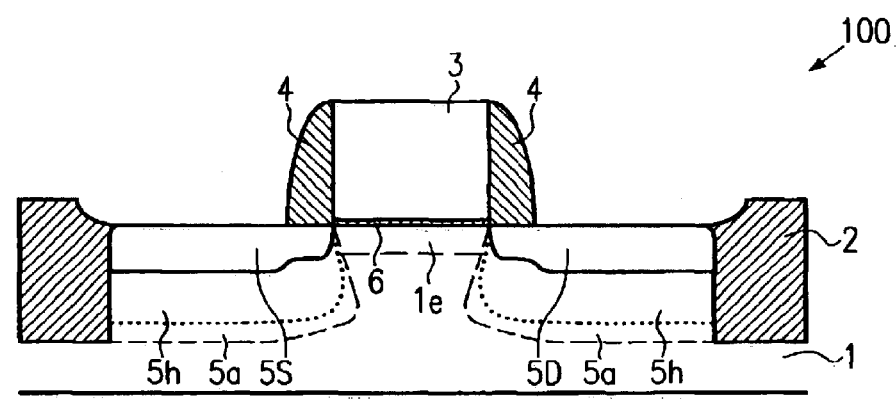

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is understood to be of particular advantage when used for forming field effect transistors. For this reason, examples will be given in the following in which corresponding embodiments of the present invention are applied to the formation of field effect transistors. However, it has to be noted that the use of the present invention is not limited to the formation of field effect transistors, but rather the present invention can be used in any other situation in which the realization of a homogeneously strained surface layer on a crystalline substrate and/or a crystalline workpiece is required. In particular, the present invention can be carried out in all those situations in which an improved mobility of the electrical charges is desired in predefined portions of a crystalline substrate and/or workpiece. The present invention is therefore applicable to these situations and the active regions of field effect transistors described in the following illustrative embodiments are to represent any such portion or region of a substrate.

Figure 3A:
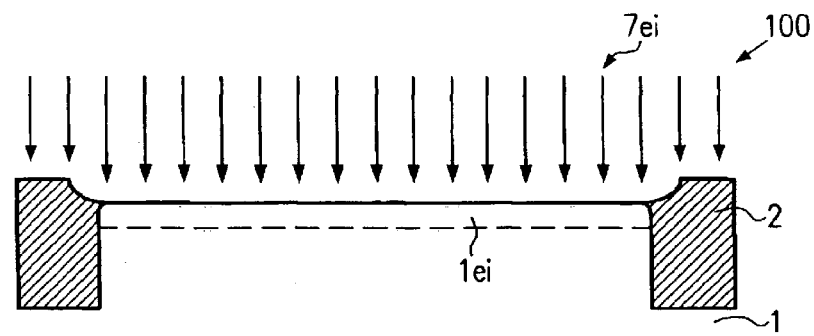
FIGS. 3a–3c represent a sequence of a method according to a first embodiment of the present invention for forming the active regions of a field effect transistor.
Figure 3B:
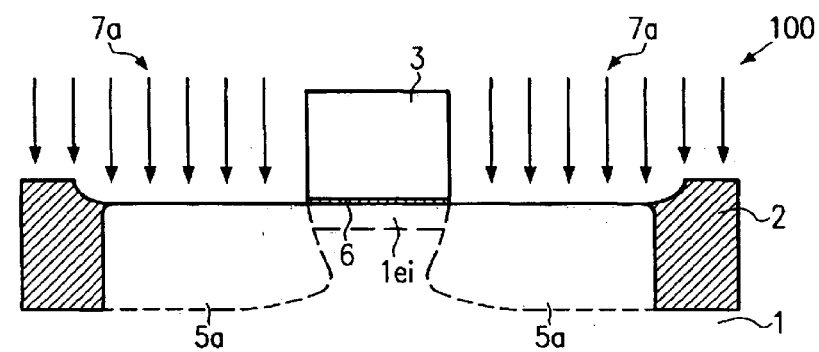
Figure 3C:
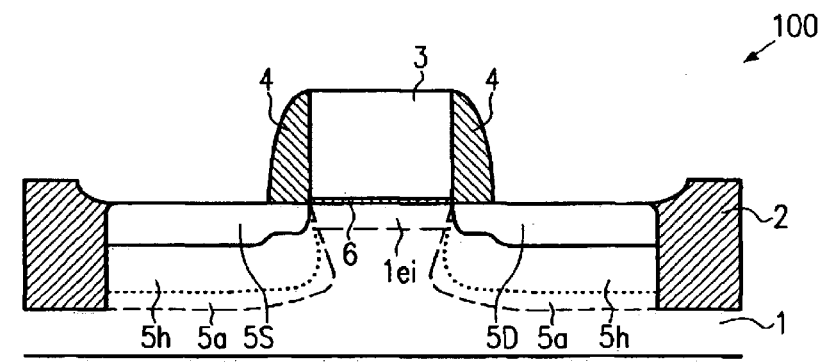

With reference to FIGS. 3a–3c, a process sequence for forming the active regions of a field effect transistor according to a first embodiment of the present invention comprising the generation of a strained surface layer will now be described.

In FIG. 3a, reference 1 relates to a substrate (for instance, a silicon substrate) on which a field effect transistor is to be formed, such as, for example, a PMOS, an NMOS, or a CMOS transistor. Reference 2 relates to isolation structures defining an active region of the transistor. The isolation structures 2 are provided as shallow trench isolation (STI) structures. However, other isolation structures, for instance, LOCOS (local oxidation of silicon) structures may also be formed instead of the STI structures. The isolation structures 2 especially comprise an insulating material such as silicon dioxide, silicon nitride, or the like. Reference 1ei relates to a strained surface layer generated and/or formed on the surface of the substrate 1.

In FIGS. 3b–3c, the features already described with reference to FIG. 3a are identified by the same reference numerals. In particular, in FIG. 3b, reference 6 relates to a gate insulation structure formed on the substrate 1 according to well-known prior art techniques and reference 3 identifies a polysilicon line formed on the gate insulation structure 6. In the following, the combination of the gate insulation structures 6 and the polysilicon line 3 will also be referred to as a polysilicon gate structure. Also, in FIG. 3b, reference 7a relates to an ion beam to which the substrate 1 is exposed for forming amorphous regions in those portions of the substrate 1 not covered by the polysilicon gate structure. Reference 5a identifies such amorphous regions.

In FIG. 3c, reference 5h relates to halo structures which are formed in the substrate 1 for the purpose of suppressing and/or minimizing short channel behaviors, such as, for instance, punch-through. Such halo structures 5h are especially formed when transistors are fabricated with feature sizes on the order of 2 $\mu$m or less. For transistors with larger feature sizes, the formation of the halo structures 5h may be avoided. Reference 4 of FIG. 3c identifies sidewall spacers formed on the sidewalls of the polysilicon gate structure. Finally, references 5S and 5D identify the source and drain regions of the transistor 100, respectively.

According to the embodiment depicted in FIGS. 3a–3c, the manufacturing process starts with the formation of a strained layer 1ei on the surface of the substrate 1 (see FIG. 3a). In particular, it has to be noted that the strained surface layer 1ei can be formed either prior to or after the formation of the isolation structures 2. In the example depicted in FIGS. 3a–3c, the isolation structures 2 are formed first. However, the strained layer 1ei may be formed first and the isolation structures 2 may be formed thereafter.

As depicted in FIG. 3a, the strained surface layer 1ei is formed by implanting ions of a dopant material into the substrate. To this end, the substrate 1 is exposed to an ion beam 7ei. In one illustrative embodiment, xenon is implanted into the substrate 1 to form the strained surface layer 1ei. However, other heavy inert ions may be used. In particular, germanium, silicon and argon, or a combination thereof, may be implanted for the purpose of generating the strained surface layer 1ei.

The implanting energy is normally kept between approximately 1–100 keV, while the implanting dose may be selected between approximately $10^{13}/cm^2$ and $10^{16}/cm^2$. The resulting strained surface layer 1ei may have a thickness (depth) that ranges from approximately 1–20 nm. During the further processing, any heat treatment is performed so as to substantially avoid or at least significantly reduce any restoration of the silicon grid in the surface layer 1ei, thereby maintaining the strained surface layer 1ei at least to a certain degree.

As stated above, implanting heavy inert ions at the dosage and energy levels indicated above results in the formation at the surface of the substrate 1 of a homogeneous strained layer of a predefined depth. In particular, a strained layer means that a surface layer is formed in which mechanical tension and/or stress are generated and which is eventually deformed with respect to the underlying crystalline substrate 1. Although the reasons have not been completely clarified up to this point, it is considered that the mechanical stretch and/or stress arising at the strained surface layer 1ei leads to an improved mobility of the electrical charges in the strained layer 1ei. Accordingly, when a field effect transistor is formed on a strained surface layer form ed as described above, the performances of the transistor will be advantageously affected by this mobility. In fact, the channel region of the transistor, i.e., the region between the source and drain regions, will comprise such a strained layer with improved mobility. Accordingly, the switching speed of the transistor will be improved as will the electrical performance of the transistor.

Once the strained surface layer 1ei has been formed as described with reference to FIG. 3a, the transistor 100 will be completed according to known techniques. In particular, the gate insulation structure is formed first by forming a gate insulation layer on the substrate 1, patterning said gate insulation layer according to known masking and etching steps so as to form a gate insulation structure 6 and forming a polysilicon line 3 on the gate insulation structure 6 (see FIG. 3b). Moreover, as depicted in FIG. 3b, the manufacturing process may comprise an implanting step during which the substrate 1 is exposed to an ion beam 7a for the purpose of forming amorphous regions 5a into those portions of the substrate which are not covered by the polysilicon gate structure.

The manufacturing process is then prosecuted until completion of the transistor. In particular, as depicted in FIG. 3c, halo structures 5h may be formed first by exposing the substrate 1 to an ion beam (not depicted in FIG. 3c). These halo structures are normally formed when the reduced size of the transistor requires short channel effects such as punch-through to be suppressed.

Subsequently, a further implanting step is performed for the purpose of forming the source and drain extension regions (not depicted in FIG. 3c) of the transistor. Once the source and drain extension regions have been formed, sidewall spacers 4 are formed on the sidewalls of the polysilicon gate structure and a further implanting step is performed for the purpose of implanting ions into those portions of the transistor not covered by the polysilicon gate structures and the sidewall spacers 4 so as to obtain the desired dopant concentrations for the source and drain regions 5S and 5D of the transistor.

In the following, a description will be given with reference to FIGS. 4a–4c of a process sequence for forming a field effect transistor comprising the generation of a strained surface layer according to a further embodiment of the present invention.

Figure 4A:
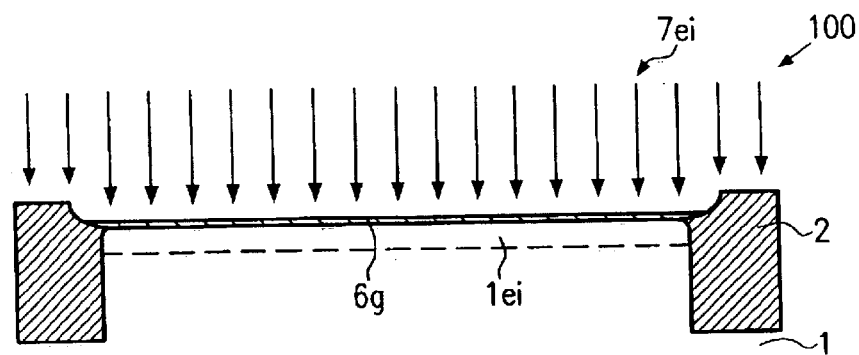
FIGS. 4a–4c represent a process sequence of a method according to a further embodiment of the present invention for forming the active regions of a field effect transistor.
Figure 4B:
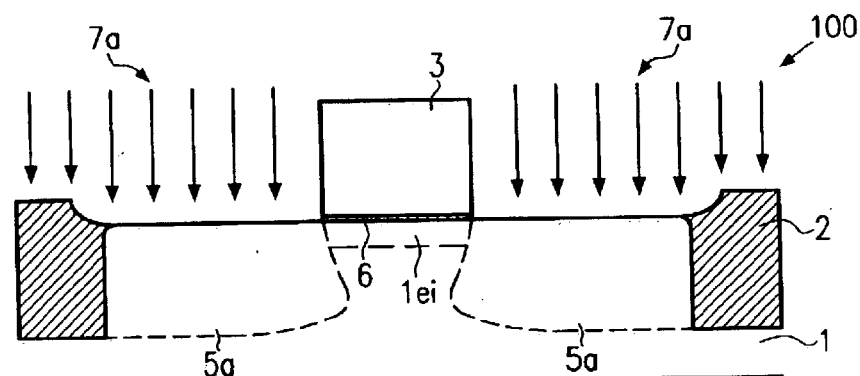
Figure 4C:
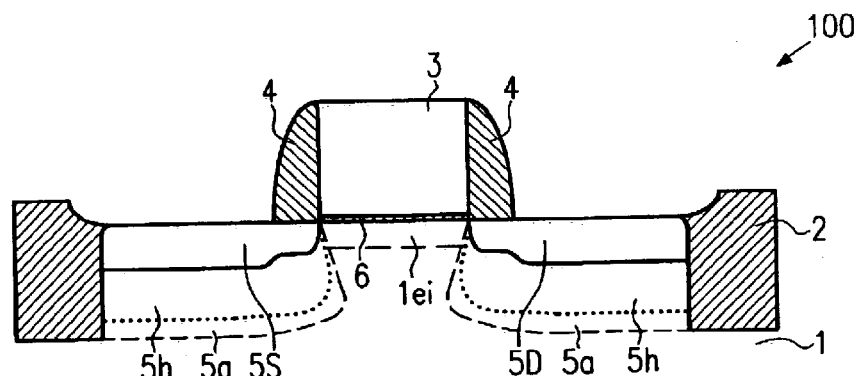

In FIGS. 4a–4c, those features already described with reference to FIGS. 3a–3c are identified by the same reference numerals. In addition, in FIG. 4a, reference 6g identifies a thin insulating layer, for instance a silicon oxide layer, formed on the surface of the substrate 1. The embodiment depicted in FIGS. 4a–4c differs from the embodiment depicted in FIGS. 3a–3c in that the insulating layer 6g is formed first and the strained surface layer 1ei is formed subsequently by implanting heavy inert ions through the insulating film 6g into the substrate 1. The insulating layer 6g may be formed according to techniques well known in the art. For instance, thermal oxidation processes may be carried out to this end. Alternatively, silicon nitride or silicon dioxide may be deposited on the surface 1. As stated above, according to the present embodiment, heavy inert ions (for instance, xenon, germanium, silicon, or argon, or a combination thereof) are implanted through the insulating layer 6g so as to form the strained surface layer 1ei. To this end, the substrate 1 and the overlying insulating layer 6g are exposed to an ion beam 7ei in the same way as in the embodiment of FIGS. 3a–3c. Also, the implanting dose and the implanting energy may be the same as in the embodiment of FIGS. 3a–3c. In one embodiment, the insulating layer 6g may represent a sacrificial screen layer that is removed after the implantation sequence and a further insulating layer (not shown) may be formed to serve as a gate insulation layer for the transistor to be formed. This additional insulating layer, as well as the insulating layer 6g, may be formed as described above. Hereinafter, it is referred to the gate insulating layer 6g, wherein the layer 6g is meant to represent a layer appropriate to be patterned as a gate insulation layer, irrespective whether the layer 6g is a single layer as shown in FIG. 4a, or is to represent a sacrificial screen layer followed by the actual gate insulation layer.

Once the strained surface layer 1ei has been formed, the insulating layer 6g is patterned according to well-known masking and etching techniques so as to form a gate isolating structure 6. A polysilicon line 3 is then formed on the gate insulating structure 6 and the process afterwards is carried out as in the embodiment depicted with reference to FIGS. 3a–3c. In particular, amorphous regions 5a may be formed as depicted in FIG. 4b and the manufacturing process may be prosecuted so as to form the sidewall spacers 4, the halo structures 5h, and the source and drain regions 5S and 5D of FIG. 4c. For more details concerning the processing steps schematically depicted in FIGS. 4b–4c, reference is made to the disclosure given with reference to FIGS. 3b–3c.

The advantages offered by the present invention may be summarized as follows. A strained surface layer may be generated without negatively affecting the overall manufacturing costs and by using the usual equipment. The strained surface layer exhibits an improved mobility, resulting in an improved switching speed and electrical performance of the transistor formed on said strained layer. Moreover, the flat strained surface layer keeps the crystal damage away from the source and drain junctions, thus allowing smaller leakage than in the pre-amorphized regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming at least one field effect transistor on a substrate, the method comprising:

forming a gate insulation layer for said at least one field effect transistor on a surface of said substrate;

after forming said gate insulation layer, forming a strained surface layer on a surface of said substrate by implanting germanium ions through said gate insulation layer and said surface of said substrate;

forming at least one gate structure above said strained surface layer; and performing additional process steps to manufacture said at least one field effect transistor, wherein a thermal budget in manufacturing the at least one field effect transistor is adjusted to substantially avoid silicon grid restoration in the strained surface layer.

2. The method of claim 1, where, in forming said strained surface layer, ions of at least one of xenon, and argon, are also implanted.

3. The method of claim 1, wherein the implanting energy is selected in the range of approximately 10–100 keV.

4. The method of claim 1, wherein the implanting dose is selected in the range of approximately $10^{13}/cm^2$–$10^{16}/cm^2$.

5. The method of claim 1, wherein said substrate comprises one of silicon and germanium or a combination thereof.

6. The method of claim 1, wherein said field effect transistor is one of an NMOS, a PMOS and a CMOS transistor.

7. A method of forming at least one field effect transistor on a substrate, the method comprising:

forming a gate insulation layer for said at least one field effect transistor on a surface of said substrate;

forming a strained surface layer on a surface of said substrate by implanting germanium ions through said gate insulation layer and into said substrate, said strained surface layer having a thickness less than 20 nm;

forming at least one gate electrode structure above said gate insulation layer after forming said strained surface layer; and performing additional process steps to manufacture said at least one field effect transistor, wherein a thermal budget in manufacturing the field effect transistor is adjusted to substantially avoid silicon grid restoration in the strained surface layer.

8. The method of claim 7, wherein, in forming said strained surface layer, ions of at least one of xenon and argon are also implanted.

9. A method of forming at least one field effect transistor on a substrate, the method comprising:

forming a gate insulation layer for said at least one field effect transistor on a surface of said substrate;

after forming said gate insulation layer, forming a strained surface layer on a surface of said substrate by implanting xenon ions through said gate insulation layer and said surface of said substrate;

forming at least one gate structure above said strained surface layer; and performing additional process steps to manufacture said at least one field effect transistor, wherein a thermal budget in manufacturing the at least one field effect transistor is adjusted to substantially avoid silicon grid restoration in the strained surface layer.

10. The method of claim 9, wherein, in forming said strained surface layer, ions of at least one of argon and germanium ions are also implanted.

11. A method of forming at least one field effect transistor on a substrate, the method comprising:

forming a gate insulation layer for said at least one field effect transistor on a surface of said substrate;

forming a strained surface layer on a surface of said substrate by implanting xenon ions through said gate insulation layer and into said substrate, said strained surface layer having a thickness lens than 20 nm;

forming at least one gate electrode structure above said gate insulation layer after forming said strained surface layer; and performing additional process step to manufacture said at least one field effect transistor, wherein a thermal budget in manufacturing the field effect transistor is adjusted to substantially avoid silicon grid restoration in the strained surface layer.

12. The method of claim 11, wherein, in forming said strained surface layer, ions of at least one of argon and germanium ions are also implanted.

13. A method of forming at least one field effect transistor on a substrate, the method comprising:

forming a gate insulation layer for said at least one field effect transistor on a surface of said substrate;

after forming said gate insulation layer, forming a strained surface layer on a surface of said substrate by implanting argon ions through said gate insulation layer and said surface of said substrate;

forming at least one gate structure above said strained surface layer; and performing additional process steps to manufacture said at least one field effect transistor, wherein a thermal budget in manufacturing the at least one field effect transistor is adjusted to substantially avoid silicon grid restoration in the strained surface layer.

14. The method of claim 13, wherein, in forming said strained surface layer, ions of at least one of xenon and germanium are also implanted.

15. A method of forming at least one field effect transistor on a substrate, the method comprising:

forming a gate insulation layer for said at least one field effect transistor on a surface of said substrate;

forming a strained surface layer on a surface of said substrate by implanting argon ions through said gate insulation layer and into said substrate, said strained surface layer having a thickness less than 20 nm;

forming at least one gate electrode structure above said gate insulation layer after forming said strained surface layer; and performing additional process steps to manufacture said at least one field effect transistor, wherein a thermal budget in manufacturing the field effect transistor is adjusted to substantially avoid silicon grid restoration in the strained surface layer.

16. The method of claim 15, wherein, in forming said strained surface layer, ions of at least one of xenon and germanium are also implanted.

* * * * *